United States Patent [19]

Leary

[11] Patent Number: 5,079,217

[45] Date of Patent: Jan. 7, 1992

[54] PROCESS FOR PREPARING HOMOGENOUS SUPERCONDUCTORS BY HEATING IN A NITROGEN DIOXIDE CONTAINING ATMOSPHERE

[75] Inventor: Kevin J. Leary, New Castle, Del.

[73] Assignee: E. I. Du Pont de Nemours and Company, Wilmington, Del.

[21] Appl. No.: 478,063

[22] Filed: Feb. 7, 1990

Related U.S. Application Data

[63] Continuation of Ser. No. 277,000, Nov. 28, 1988, abandoned.

[51] Int. Cl.$^5$ .......................... C01B 13/14; C01G 3/02
[52] U.S. Cl. ......................................... 505/1; 252/521; 423/596; 423/604; 505/725; 505/742
[58] Field of Search .......................... 505/1, 725, 742; 252/521; 423/604, 596

[56] References Cited

U.S. PATENT DOCUMENTS

| | | | |
|---|---|---|---|
| 4,771,015 | 9/1988 | Kanai et al. | 437/109 |
| 4,942,181 | 7/1990 | Capone et al. | 505/1 |

OTHER PUBLICATIONS

Nakai et al., *Japanese Journal of Applicant Physics Letter*, vol. 26, No. 5, pp. 788-790.
Oda et al., *Japanese Journal of Applicant Physics Letter*, vol. 26, No. 5, pp. 804-806.
Farneth, "Kinetics and Thermodynamics of the reaction of . . . ", *Mat. Res. Soc. Symp. Proc.*, vol. 99, Dec., 1987, pp. 977-980.
Wang, "Y Ba$_2$Cu$_3$O$_{7-\delta}$ Superconductors Produced by Hot-Pressing . . . ", Mat. Res. Soc. Symp. Proc., vol. 99, Dec., 1987, pp. 257-260.
Kumakura "Large Magnetization in YBa$_2$ Cu$_3$O$_7$ Prepared by . . . ", *Jap. Jnl. Appld. Phys. Lett.* vol. 27, No. 2, Feb., 1988, pp. L188-L190.
Mizuno, "Reactions of the Monoxides of Carbon and Nitrogen . . . ", *J. Chem. Soc. Chem Comm.*, 1988.
Herrman, "Preparation and Properties of High T$_c$ Superconducting . . . ", *Physica Status Solid:* 1987.
Matthews, "Increased Transition Temperature in YB$_n$-2Cu$_3$O$_y$ . . . ", *Nature*, vol. 328, Aug. 27, 1987, pp. 786-787.
Saito, "Properties of the Superconductor (Sr, Ca)—La—Cu—O . . . ", *Jap. Jnl. Appl. Phys.*, v. 26 (4), Apr. 1987, pp. L366-L367.
D. N. Matthews, et al., Nature, vol. 328, pp. 786-787, Aug. (1987).
N. Mizuno, et al., J. Chem. Soc., pp. 887-888 (1988).
R. Herrmann, Physica Status Solidi (b) 142, K53, pp. 53-56 (1987).
U.S. Ser. No. 153107 filed 02-08-88.
U.S. Ser. No. 236088 filed 08-24-88.
Bednorz et al., Z. Phys. B64, 189 (1986).
Rao et al., Current Science 56, 47 (1987).
Chu et al., Science 235, 567 (1987).
Chu et al., Phys. Rev. Lett. 58, 405 (1987).
Cava et al., Phys. Rev. Lett. 58, 408 (1987).
Bednorz et al., Europhys. Lett. 3, 379 (1987).
Wu et al., Phys. Rev. Lett. 58, 908 (1987).
Cava et al., Phys. Rev. Lett. 58, 1676 (1987).
Michel et al., Z. Phys. B-Condensed Matter 68, 421 (1987).
Maeda et al., Jpn. J. Appl. Phys. 27, L209 (1988).
Subramanian et al., Science 239, 1015 (1988).
Sheng et al., Nature 332, 55 (1988).
Sheng et al., Nature 332, 138 (1988).
Hazen et al., Phys. Rev. Lett. 60, 1657 (1988).
Torardi et al., Science 240, 631 (1988).
Parkin et al., Phys. Rev. Lett. 61, 750 (1988).
Hervieu et al., J. Solid State Chem. 75, 212 (1988).
Torardi et al., Phys. Rev. B 38, 225 (1988).
Liang et al., Appl. Phys. Lett. 53, 1434 (1988).
Marinenko et al., "Microbeam Analysis", Ed. D. E. Newbury, San Francisco Press, San Francisco, Calif. (1988), p. 37.

Primary Examiner—Paul Lieberman
Assistant Examiner—John Boyd
Attorney, Agent, or Firm—John A. Parrish

[57] ABSTRACT

This invention relates to homogeneous copper-containing oxide superconductors with improved superconducting properties and a process for preparing them.

8 Claims, 5 Drawing Sheets

CONVENTIOAL YBa$_2$Cu$_3$O$_x$ POWDER

YBa$_2$Cu$_3$O$_x$ POWDER OF THE INVETION

PROCESS FOR PREPARING HOMOGENOUS SUPERCONDUCTORS BY HEATING IN A NITROGEN DIOXIDE CONTAINING ATMOSPHERE

This application is a continuation of application Ser. No. 07/277,000 filed Nov. 28, 1988 now abandoned.

BACKGROUND OF THE INVENTION

Bednorz and Muller, Z. Phys. B64, 189 (1986), disclose a superconducting phase in the La-Ba-Cu-O system with a superconducting transition temperature of about 35 K. This disclosure was subsequently confirmed by a number of investigators [see, for example, Rao and Ganguly, Current Science, 56, 47 (1987), Chu et al., Science 235, 567 (1987), Chu et al., Phys. Rev. Lett. 58, 405 (1987), Cava et al., Phys Rev. Lett. 58, 408 (1987), Bednorz et al., Europhys. Lett. 3, 379 (1987)]. The superconducting phase has been identified as the composition $La_{1-x}(Ba,Sr,Ca)_xO_{4-y}$ with the tetragonal $K_2NiF_4$-type structure and with x typically about 0.15 and y indicating oxygen vacancies.

Wu et al., Phys. Rev. Lett. 58, 908 (1987), disclose a superconducting phase in the Y-Ba-Cu-O system with a superconducting transition temperature of about 90 K. The compounds investigated were prepared with nominal compositions $(Y_{1-x}Ba_x)_2CuO_{4-y}$ and $x=0.4$ by a solid-state reaction of appropriate amounts of $Y_2O_3$, $BaCO_3$ and CuO in a manner similar to that described in Chu et al., Phys. Rev. Lett. 58, 405 (1987). Said reaction method comprises heating the oxides in a reduced oxygen atmosphere of $2 \times 10^{-5}$ bars (2 Pa) at 900° C. for 6 hours. The reacted mixture is pulverized and the heating step is repeated. The thoroughly reacted mixture was then pressed into 3/16 inch (0.5 cm) diameter cylinders for final sintering at 925° C. for 24 hours in the same reduced oxygen atmosphere. Cava et al., Phys. Rev. Lett. 58, 1676 (1987), have identified this superconducting Y-Ba-Cu-O phase to be orthorhombic, distorted, oxygen-deficient perovskite $YBa_2Cu_3O_{9-\delta}$ where $\delta$ is about 2.1 and present the powder x-ray diffraction pattern and lattice parameters.

Hundreds of other papers have since disclosed similar solid state reaction processes. Other papers have disclosed various solution and precipitation methods for preparing the reactants to be heated.

C. Michel et al., Z. Phys. B -Condensed Matter 68, 421 (1987), disclose a novel family of superconducting oxides in the Bi-Sr-Cu-O system with composition close to $Bi_2Sr_2Cu_2O_{7+\delta}$. A pure phase was isolated for the composition $Bi_2Sr_2Cu_2O_{7+\delta}$. The X-ray diffraction pattern for this material exhibits some similarity with that of perovskite and the electron diffraction pattern shows the perovskite subcell with the orthorhombic cell parameters of a=5.32 A (0.532 nm), b=26.6 A (2.66 nm) and c =48.8 A (4.88 nm). The material made from ultrapure oxides has a superconducting transition with a midpoint of 22 K as determined from resistivity measurements and zero resistance below 14 K. The material made from commercial grade oxides has a superconducting transition with a midpoint of 7 K.

H. Maeda et al., Jpn. J. Appl. Phys. 27, L209 (1988), disclose a superconducting oxide in the Bi-Sr-Ca-Cu-O system with the composition near $BiSrCaCu_2O_x$ and a superconducting transition temperature of about 105 K.

The commonly assigned application, "Superconducting Metal Oxide Compositions and Process For Making Them", S. N. 153,107, filed Feb. 8, 1988, a continuation-in-part of S. N. 52,186, filed Feb. 4, 1988, disclose superconducting compositions having the nominal formula $Bi_aSr_bCa_cCu_3O_x$ wherein a is from about 1 to about 3, b is from about ⅜ to about 4, c is from about 3/16 to about 2 and $x=(1.5\ a+b+c+y)$ where y is from about 2 to about 5, with the proviso that b+c is from about 3/2 to about 5, said compositions having superconducting transition temperatures of about 70 K or higher. It also discloses the superconducting metal oxide phase having the formula $Bi_2Sr_{3-z}Ca_zCu_2O_{8+w}$ wherein z is from about 0.1 to about 0.9, preferably 0.4 to 0.8 and w is greater than zero but less than about 1. M. A. Subramanian et al., Science 239, 1015 (1988) also disclose the $Bi_2Sr_{3-z}Ca_zCu_2O_{8+w}$ superconductor.

Z. Z. Sheng et al., Nature 332, 55 (1988) disclose superconductivity in the Tl-Ba-Cu-O system in samples which have nominal compositions $Tl_2Ba_2Cu_3O_{8+x}$ and $TlBaCu_3O_{5.5+x}$. Both samples are reported to have onset temperatures above 90 K and zero resistance at 81 K. The samples were prepared by mixing and grinding appropriate amounts of $BaCO_3$ and CuO with an agate mortar and pestle. This mixture was heated in air at 925° C. for more than 24 hours with several intermediate grindings to obtain a uniform black oxide Ba-Cu oxide powder which was mixed with an appropriate amount of $Tl_2O_3$, completely ground and pressed into a pellet with a diameter of 7 mm and a thickness of 1-2 mm. The pellet was then put into a tube furnace which had been heated to 880°-910° C. and was heated for 2-5 minutes in flowing oxygen. As soon as it had slightly melted, the sample was taken from the furnace and quenched in air to room temperature. It was noted by visual inspection that $Tl_2O_3$ had partially volatilized as black smoke, part had become a light yellow liquid, and part had reacted with Ba-Cu oxide forming a black, partially melted, porous material.

Z. Z. Sheng et al., Nature 332, 138 (1988) disclose superconductivity in the Tl-Ca-Ba-Cu-O system in samples which have nominal compositions $Tl_2Ca_2BaCu_3O_{9+x}$ with onset of superconductivity at 120 K.

R. M. Hazen et al., Phys. Rev. Lett. 60, 1657 (1988), disclose two superconducting phases in the Tl-Ba-Ca-Cu-O system, $Tl_2Ba_2Ca_2Cu_3O_{10}$ and $Tl_2Ba_2CaCu_2O_8$, both with onset of superconductivity near 120 K. C. C. Torardi et al., Science 240, 631 (1988) disclose the preparation of $Tl_2Ba_2Ca_2Cu_3O_{10}$ with an onset of superconductivity of 125 K.

S. S. P. Parkin et al., Phys. Rev. Lett. 61, 750 (1988), disclose the structure $TlBa_2Ca_2Cu_3O_{9\pm y}$ with transition temperatures up to 110 K.

M. Hervieu et al., J. Solid State Chem. 75,212 (1988), disclose the oxide $TlBa_2CaCu_2O_{8-y}$.

C. C. Torardi et al., Phys. Rev. B 38, 225 (1988), disclose the oxide $Tl_2Ba_2CuO_6$ with an onset of superconductivity at about 90 K.

The commonly assigned application, "Superconducting Metal Oxide Compositions and Processes For Manufacture and Use", S. N. 236,088, filed Aug. 24, 1988, a continuation-in-part of S. N. 230,636, filed Aug. 10, 1988, disclose superconducting compositions having the nominal formula $Tl_ePb_aCa_bSr_cCu_dO_x$ wherein a is from about 1/10 to about 3/2, b is from about 1 to about 4, c is from about 1 to about 3, d is from about 1 to about 5, e is from about 3/10 to about 1 and $x=(a+b+c+d+e+y)$ where y is from about ½ to about 3. These compositions have an onset of superconductivity of at least 70 K.

J. M. Liang et al., Appl. Phys. Lett. 53, 15 (1988) disclose a composition $TlBa_2Ca_3Cu_4O_x$ with an onset of superconductivity at 155 K and a zero resistance at 123 K. $CaCO_3$, $BaCO_3$ and CuO powders were ground together and calcined for 15 hours with intermediate grindings. The Ba-Ca-Cu-O powders were mixed with $Tl_2O_3$ to yield a mixture with nominal composition $TlBaCa_3Cu_3O_x$. This mixture was ground, pressed and sintered for 15 minutes in flowing $O_2$. Composition ratios of the Tl:Ca:Ba:Cu in the superconductor vary from 1:2:2:3 to 1:2:3:4.

Marinenko et al., "Microbeam Analysis", Ed. D. E. Newbury, San Francico Press, San Francisco, CA (1988), p. 37, disclose the use of wavelength-dispersive X-ray compositional mapping to study $YBa_2Cu_3O_{6+x}$ powders prepared by conventional solid state reaction techniques. Their elemental maps revealed a significant number of fairly large areas within the particles where the stoichiometry did not correspond to an atomic ratio of Y:Ba:Cu of 1:2:3. Moreover, in many cases, these regions were larger than the particle size of the original powders, indicating that these impurity phases were not the result of incomplete reaction, but instead were formed during processing.

SUMMARY OF THE INVENTION

This invention provides homogeneous, substantially single phase high temperature copper-containing superconductor powders and sintered-powder articles, as well as a process for preparing them.

In particular, it provides homogeneous $MBa_2Cu_3O_x$ powder, wherein M is at least one elememt chosen from the group consisting of Y, La, Nd, Sm, Eu, Gd, Dy, Ho, Er, Tm, Yb and Lu, and x is from about 6.5 to about 7.0, preferably from about 6.8 to about 7.0, said powder comprised predominantly of slab-like particles with the maximum planar dimensions of the slab-like particles being from about 0.5 to about 100 $\mu m$, preferably from about 1.0 to about 10 $\mu m$, and a maximum thickness:-maximum planar dimension ratio of about 1:1 to 1:10.

This invention also provides a process for preparing homogeneous $MBa_2Cu_3O_x$, wherein M is at least one elememt chosen from the group consisting of Y, La, Nd, Sm, Eu, Gd, Dy, Ho, Er, Tm, Yb and Lu, and x is from about 6.5 to about 7.0, preferably from about 6.8 to about 7.0, said process comprising (a) heating at least one starting material selected from the group consisting of $MBa_2Cu_3O_x$, $MBa_2Cu_3O_y$ wherein y is from about 6.0 to about 6.5, and a mixture of M-,Ba-, and Cu-containing $MBa_2Cu_3O_x$ precursors in an M:Ba:Cu atomic ratio of about 1:2:3 in the presence of a nitrogen dioxide-containing atmosphere at a temperature of from about 600° C. to about 1000° C. for at least about 1 hour, (b) heating the product of step (a) in the presence of an oxygen-containing atmosphere at a temperature of from about 700° C. to about 975° C. for at least about one-half hour, and (c) maintaining the product of step (b) in the presence of an oxygen-containing atmosphere while cooling for a time sufficient to obtain the $MBa_2Cu_3O_x$ product Preferably, M is Y.

This invention also provides the product made by the above process.

DETAILED DESCRIPTION OF THE INVENTION

Figure 1:
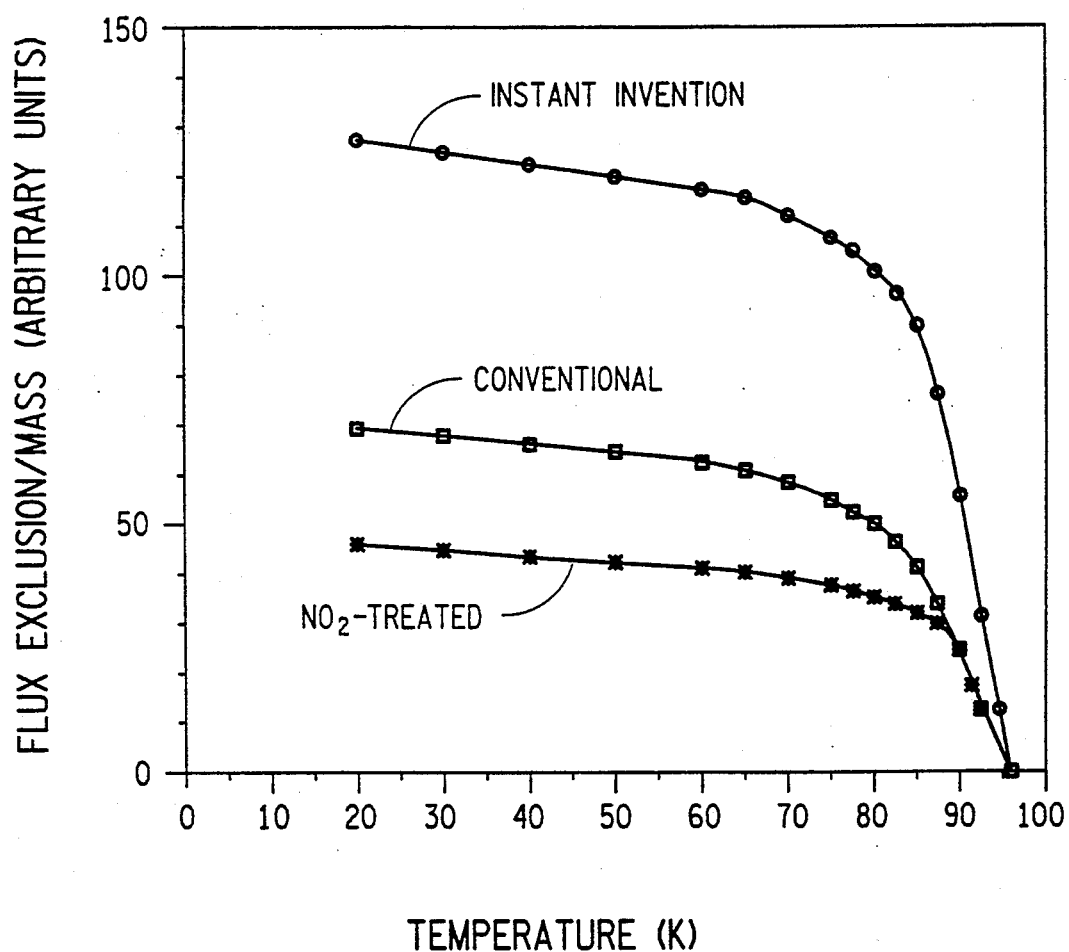
FIG. 1 is a plot of flux exclusion per unit mass of sample versus temperature for conventional $YBa_2Cu_3O_x$ powder, $YBa_2Cu_3O_x$ powder subjected only to the heating in the nitrogen dioxide-containing atmosphere and the $YBa_2Cu_3O_x$ powder of the invention.

The product of this invention is a homogeneous copper containing oxide superconductor with relatively uniform and well-defined morphology. The products of this invention exhibit a large increase in flux exclusion which indicates a large increase in the portion of the material which is superconducting. The particles of the powder products are predominantly within a relatively small range of size and are of well-defined morphology.

This invention provides a process for improving the homogeneity of and thereby the superconducting properties of high temperature metal oxide superconductors containing copper by heating them in a nitrogen dioxide-containing atmosphere and then heating and cooling them in an oxygen-containing atmosphere. The process of this invention can also be used to directly produce homogeneous high temperature metal oxide superconductors having improved properties from precursors of the metal oxide superconductors. In either instance, the sample used in the process can be in the form of a powder or of a shaped article such as a thin film, a thick film, a coating layer, tape, fiber, sintered pieces, etc.

In particular, this invention provides a process for improving the homogeneity of $MBa_2Cu_3O_x$ or forming a homogeneous superconductor from non-superconducting tetragonal $MBa_2Cu_3O_y$. The $MBa_2Cu_3O_x$ products of this invention exhibit a large increase in flux exclusion over that of the conventionally prepared $MBa_2Cu_3O_x$, the increase indicating a large increase in the portion of the material which is superconducting. Product powder has greatly improved slab-like morphology which may facilitate the processing of these powder particles.

The process of this invention can also be used to directly produce $MBa_2Cu_3O_x$ superconductors having these improved properties from precursors of $MBa_2Cu_3O_x$.

The process of the invention comprises (a) heating at least one starting material selected from the group consisting of $MBa_2Cu_3O_x$, $MBa_2Cu_3O_y$ and stoichiometric mixtures of precursors of $MBa_2Cu_3O_x$ in a nitrogen dioxide-containing atmosphere at temperatures of from about 600° C. to about 1000° C. for at least about 1 hour, (b) heating the product of step (a) in an oxygen-containing atmosphere at a temperature of from about 700° C. to about 975° C. for at least about one-half hour, and (c) maintaining the product of step (b) in an oxygen-containing atmosphere while cooling for a time sufficient to obtain the $MBa_2Cu_3O_x$ product.

When the process of the invention is used to improve the homogeneity and superconducting properties of a sample of $MBa_2Cu_3O_x$ or to produce homogeneous $MBa_2Cu_3O_x$ from $MBa_2Cu_3O_y$, heating in a nitrogen dioxide-containing atmosphere is carried out at a temperature of from about 700° C. to about 1000° C. for about 1 hour or more. The temperature is preferably from about 900° C. to about 975° C. Larger shaped articles may require longer heating times as well as longer annealing and cooling times.

When the process of the invention is used to produce homogeneous $MBa_2Cu_3O_x$ directly from a mixture of precursors, the precursor mixture is comprised of compounds of M, Ba and Cu in amounts such that the atomic ratio of M:Ba:Cu is about 1:2:3. The mixture can be formed by simply mixing compounds such as $M_2O_3$, a barium source such as $BaO_2$, BaO, $Ba(OH)_2$, $Ba(NO_3)_2$ or $BaCO_3$ and CuO. Alternatively, the mixture can be formed by precipitation, spray drying or any of the other preparations known in the art. Heating in a nitrogen dioxide-containing atmosphere is carried out at a temperature of from about 600° C. to about 900° C. for about 1 hour or more. The temperature is preferably from about 700° C. to about 800° C.

The nitrogen dioxide-containing atmosphere can be pure nitrogen dioxide, a mixture of nitrogen dioxide and an inert gas such as argon or nitrogen, or a mixture of nitrogen dioxide and a reactant gas such as oxygen, said mixtures containing at least about 1% nitrogen dioxide. The inert gas serves as a carrier of the $NO_2$.

At the temperatures indicated some of the nitrogen dioxide, $NO_2$, may have dissociated and is present in the form of nitrogen oxide, NO. Reference herein to a "nitrogen dioxide-containing atmosphere" is meant to include the dissociation products such as nitrogen oxide.

It is believed that molten $Ba(NO_3)_2$ forms in the sample during this heating stage and acts as a flux which facilitates growth of highly pure material. The amount of $Ba(NO_3)_2$ that is formed depends on the composition of the nitrogen dioxide-containing atmosphere. Larger amounts of nitrogen dioxide in the atmosphere produce larger amounts of $Ba(NO_3)_2$ and result in finer-grained product whereas smaller amounts of nitrogen dioxide produce smaller amounts of $Ba(NO_3)_2$ and result in larger-grained material. For a given amount of nitrogen dioxide in the atmosphere, larger grains are obtained when a mixture of precursors is heated than when $MBa_2Cu_3O_x$ is heated.

In the second step of the process of the invention, the sample which has been heated in the nitrogen dioxide-containing atmosphere is then heated in an oxygen-containing atmosphere at a temperature of from about 700° C. to about 975° C. for about ½ hour or more. The oxygen-containing atmosphere can be oxygen, air or a mixture of oxygen and an inert gas. Pure oxygen is preferred. Larger shaped articles may require longer times.

The sample is then cooled in an oxygen-containing atmosphere. During the cooling step, the oxygen content of the material increases to give the desired $MBa_2Cu_3O_x$ product. The additional oxygen which enters into the crystalline lattice of the material during this cooling step to form the desired product does so by diffusion. The rate at which oyygen enters the lattice is determined by a complex function of time, temperature, oxygen content of atmosphere, sample form, etc. Consequently, there are numerous combinations of these conditions that will result in the desired product. For example, the rate of oxygen uptake at 400°–500° C. is rapid and the desired product can be obtained in an hour or less at these conditions when the sample has small dimensions.

Superconductivity can be confirmed by observing magnetic flux exclusion, i.e., the Meissner effect. This effect can be measured by the method described in an article by E. Polturak and B. Fisher in Physical Review B, 36, 5586(1987).

Superconductivity can also be confirmed by observing an absence of electrical resistivity. Resistance measurements can be carried out using the four probe technique.

Marinenko et al., "Microbeam Analysis", Ed. D. E. Newbury, San Francico Press, San Francisco, CA (1988), p. 37, disclose the use of wavelength-dispersive X-ray compositional mapping to study $YBa_2Cu_3O_{6+x}$ powders prepared by conventional solid state reaction techniques. Their elemental maps revealed a significant number of fairly large areas within the particles where the stoichiometry did not correspond to an atomic ratio of Y:Ba:Cu of 1:2:3. Moreover, in many cases, these regions were larger than the particle size of the original powders, indicating that these impurity phases were not the result of incomplete reaction, but instead were formed during processing.

The lack of homogeneity in powders of $YBa_2Cu_3O_x$ prepared using conventional solid state reactions as well as in samples obtained commercially has been confirmed by the present inventor using essentially the same techniques used by Marinenko et al. Four maps were obtained for each portion of sample observed. One was a digitalized scanning electromicrograph; the other three showed the concentration of yttrium, barium and copper, each in a different color. Superposition of the maps enabled the determination of particles or regions of particles that were (1) rich or deficient in the various elements or (2) homogeneous. In each of the conventionally-prepared or commercially-obtained samples, gross segregation was observed. Only samples prepared using the instant process showed an essentially uniform distribution of elements. "Homogeneous" is to be interpretted as the essentially uniform distribution measured in this manner. Powders prepared using the instant process showed, in addition to chemical homogeneity, a substantially homogeneous slab-like morphology.

The superconducting compositions of this invention can be used to conduct current extremely efficiently or to provide a magnetic field for magnetic imaging for medical purposes. Thus, by cooling the composition in the form of a wire or bar to a temperature below the superconducting transition temperature, ($T_c$), in a manner well known to those in this field; and initiating a flow of electrical current, one can obtain such flow without any electrical resistive losses. To provide exceptionally high magnetic fields with minimal power losses, the wire mentioned previously could be wound to form a coil which would be cooled to a temperature below the superconducting transition temperature before inducing any current into the coil. Such fields can be used to levitate objects as large as railroad cars. These superconducting compositions are also useful in Josephson devices such as SQUIDS (superconducting quantum interference devices) and in instruments that are based on the Josephson effect such as high speed sampling circuits and voltage standards.

The invention is illustrated by the following nonlimiting examples.

EXAMPLE 1

Powder of nominal composition $YBa_2Cu_3O_x$ was prepared by thoroughly mechanically mixing 211.8 g $Y_2O_3$, 981.1 g $Ba(NO_3)_2$ and 447.6 g CuO, placing the mixture in an alumina tray which was placed in a furnace. The sample was heated under pure oxygen from room temperature to 970° C. over a period of 2 hours, held at 970° C. for 3 hours, cooled to 500° C. over a period of about 3 hours, held at 500° C. for 1 hour and then cooled in the furnace to room temperature. The material was then ground to a powder, passed through a 20 mesh screen (standard designation—850 μm), heated again according to the above heating schedule, ground and passed through a 20 mesh screen. The resulting powder was typical of $YBa_2Cu_3O_x$ powder obtained using conventional solid state processes.

$YBa_2Cu_3O_x$ powder (25 grams) was placed in an yttria-stabilized zirconia boat. The boat containing the powder was placed inside a quartz tube in the middle of a furnace. A mixture of about 10% nitrogen dioxide and 90% argon was passed over the sample at a rate of about 100 standard cubic centimeters per minute (sccm). The sample was heated from room temperature to 945° C. over a period of 1.5 hours, held at 945° C. for about 2 hours and then cooled to 350° C. over a period of 3 hours. The $NO_2$/Argon stream was then turned off, and about 100 sccm of pure oxygen was passed over the sample while it was cooled from 350° C. to room temperature over a period of about 5 hours. The sample was then removed from the furnace. During the heating in the nitrogen dioxide-containing atomsphere, the sample consolidated into a solid block in the shape of the boat. The sample was ground to a powder in a mortar and pestle. A portion of this powder was saved for analysis.

The rest of the ground powder was placed back in the boat and heated in flowing oxygen (about 100 sccm) from room temperature to 945° C. over a period of 3 hours, held at 945° C. for about 3 hours, cooled to 450° C. over a period of 4 hours, cooled to 400° C. over a period of 1 hour and then furnace cooled over a period of about 5 hours to room temperature. Following the heating and cooling in oxygen, the powder remained as a powder with only minimal consolidation. The powder was ground.

No significant differences were discernable in the X-ray diffraction powder patterns of the conventional and instant powders. However, the X-ray diffraction powder pattern for the powder subjected only to heating in the nitrogen dioxide-containing atmosphere indicates the presence of $Ba(NO_3)_2$. This is consistent with the observation that when the powder was being heated in $O_2$, $NO_2$ was observed in the reactor effluent when the powder was heated above 600° C.

Comparative flux exclusion measurements were performed on the following: (1) $YBa_2Cu_3O_x$ powder typical of that obtained using conventional solid state processes, (2) $YBa_2Cu_3O_x$ powder subjected only to the heating in the nitrogen dioxide-containing atmosphere and not to the heating and cooling in an oxygen-containing atmosphere, and (3) $YBa_2Cu_3O_x$ powder subjected to the heating in the nitrogen dioxide-containing atmosphere and the heating and cooling in an oxygen-containing atmosphere, i.e., the process of the invention. The results are shown in FIG. 1. In each case, the curves were normalized by the mass of the sample used in the measurement. The curve for the powder made by the conventional process is indeed representative of that obtained from $YBa_2Cu_3O_x$ powders made by such processes. Comparison of the flux exclusion per unit mass of sample vs. temperature curves for conventional powder and the powder that had been subjected to heating in the nitrogen dioxide-containing atmosphere reveals a decrease in the magnitude of the flux exclusion for the powder that had been subjected to heating in the nitrogen dioxide-containing atmosphere relative to the flux exclusion for the conventional powder. However, following the heating and cooling in an oxygen-containing atmosphere to produce the $YBa_2Cu_3O_x$ powder of the invention, the instant powder exhibited a substantially larger flux exclusion than the conventional powder. Such a large increase in flux exclusion cannot be explained by particle size effects, since in each case, the particle size is much greater than the penetration depth for $YBa_2Cu_3O_x$. The superconducting transition for the instant powder is also significantly sharper, i.e., occurs over a narrower temperature range, than for the conventional powder. This large increase in flux exclusion and sharpening of the transition are two properties improved by the instant process.

EXAMPLE 2

A 25 g portion of the conventional $YBa_2Cu_3O_x$ powder prepared in Example 1 was subjected to essentially the same process of the invention described in Example 1, except that only a portion of the solid sample formed during the heating in the nitrogen dioxide-containing atmosphere was ground to a powder prior to the heating in oxygen. The other portion was retained as a solid piece. Both the solid piece and the powder were subjected to the heating and cooling in an oxygen-containing atmosphere essentially as described in Example 1.

Figure 2:
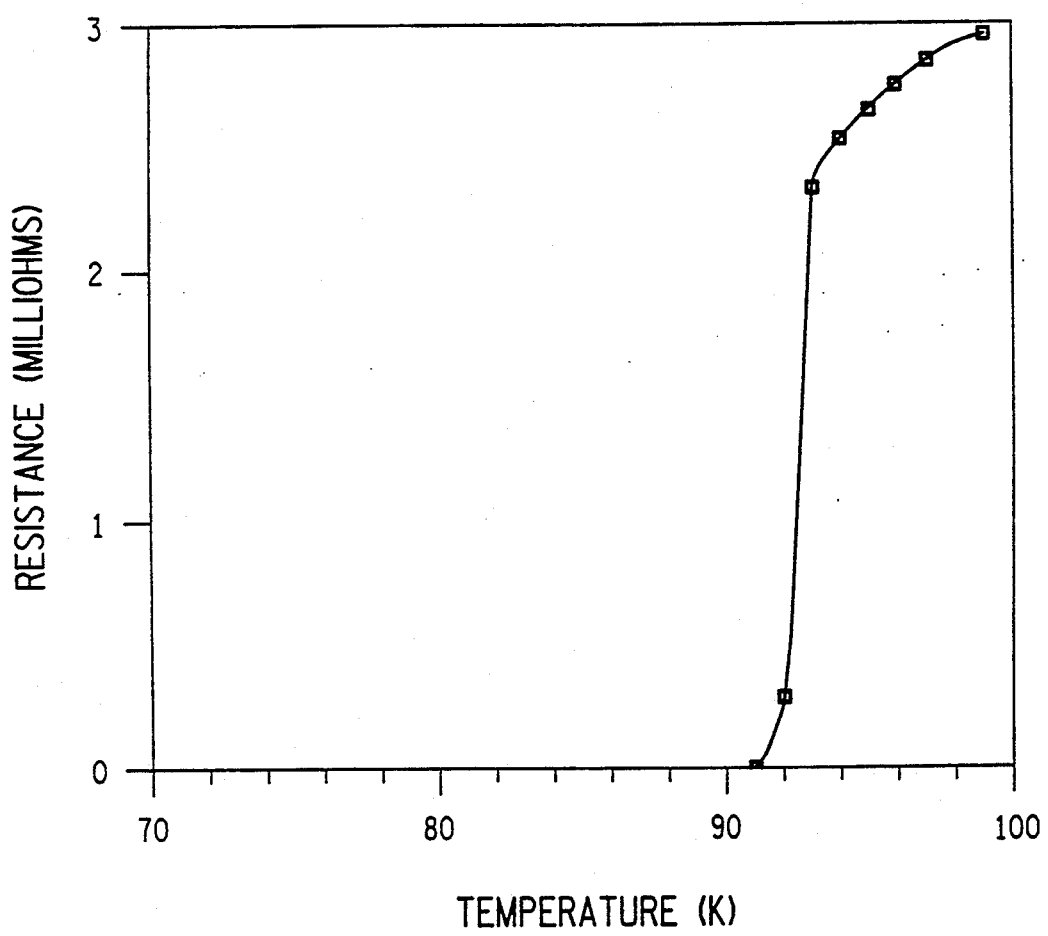
FIG. 2 is a plot of resistance versus temperature for $YBa_2Cu_3O_x$ of the invention.

The solid piece was used for four-probe resistance measurements, the results of which are shown in FIG. 2. Although this piece was not completely dense, it exhibited zero resistance at 91 K, and passed a critical current of about 30 A/cm² at 77 K with no applied magnetic field.

Figure 3A:
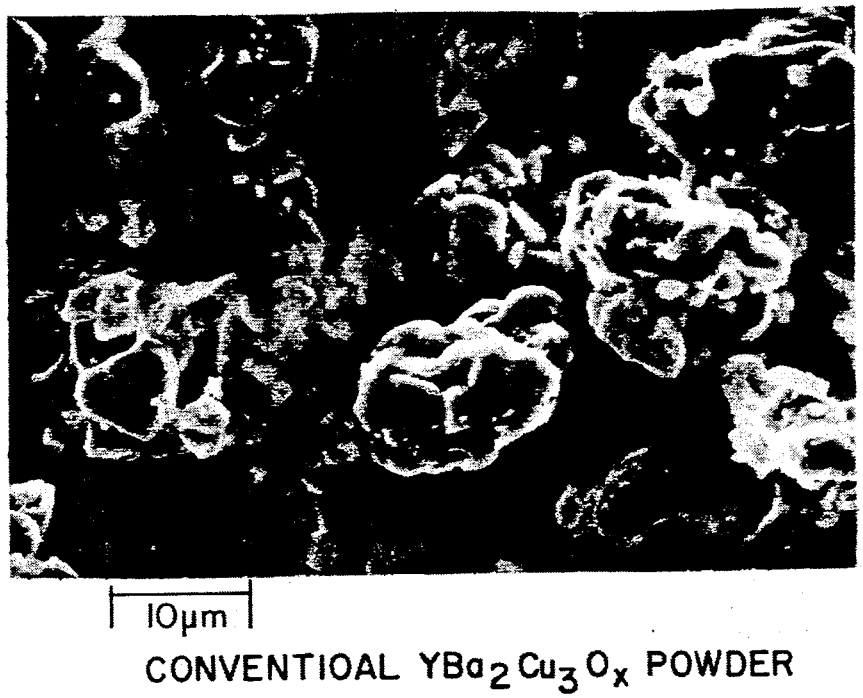
FIG. 3a is a scanning electron micrograph, of conventional $YBa_2Cu_3O_x$ powder
Figure 3B:
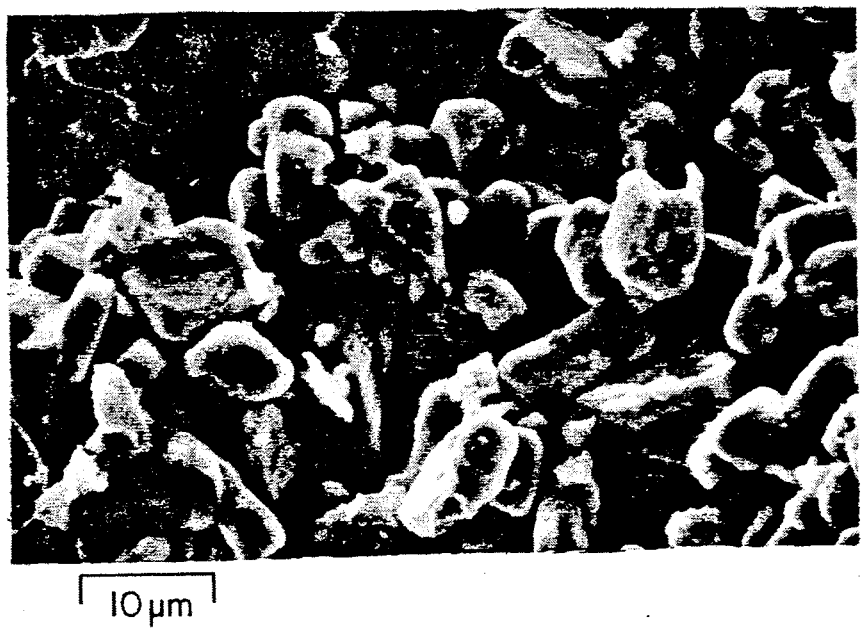
FIG. 3b is a scanning electron micrograph of $YBa_2Cu_3O_x$ powder of, the invention.

A scanning electron micrograph of conventional $YBa_2Cu_3O_x$ powder is shown in FIG. 3a. The micrograph of this powder reveals a variety of particle morphologies, ranging from semi-spherical particles to some poorly-defined slab-like particles. The micrograph also indicates the presence of small particles that may correspond to some impurity phases. A scanning electron micrograph of the powder after having undergone the process of the invention is shown in FIG. 3b. The particle morphology changed dramatically. Virtually all of the particles appear slab-like, and the particle size increased. Moreover, the number of small impurity particles are less prevalent in the treated powder, and the grain boundaries are free of extraneous phases.

EXAMPLES 3-7

These five Examples show the effect of the temperature used during the heating in the nitrogen dioxide-containing atmosphere. Five samples of conventional $YBa_2Cu_3O_x$ powder prepared in Example 1 were subjected to the process of this invention essentially as described in Example 1 with the following exceptions. For the heating in the nitrogen dioxide-containing atmosphere, Example 1 was heated to and held at 945° C. and Examples 3-7 were heated to and held at temperatures of 870° C., 895° C., 920° C., 945° C. and 970° C. respectively. Examples 4, 6 and 7 were not ground to a powder after heating in the nitrogen dioxide-containing atmosphere. Instead, following the 2 hour heating period in the nitrogen dioxide-containing atmosphere at the temperatures indicated directly above, the $NO_2$/argon stream was turned off, and pure oxygen was flowed over the sample (about 100 sccm) while the temperature was adjusted to 945° C. The samples were then held at 945° C. in the oxygen flow for 3 hours, cooled to 450° C. over a 4 hour period, cooled to 400° C. over a period of 1 hour, and then furnace cooled to room temperature over a period of about 5 hours.

Figure 4:
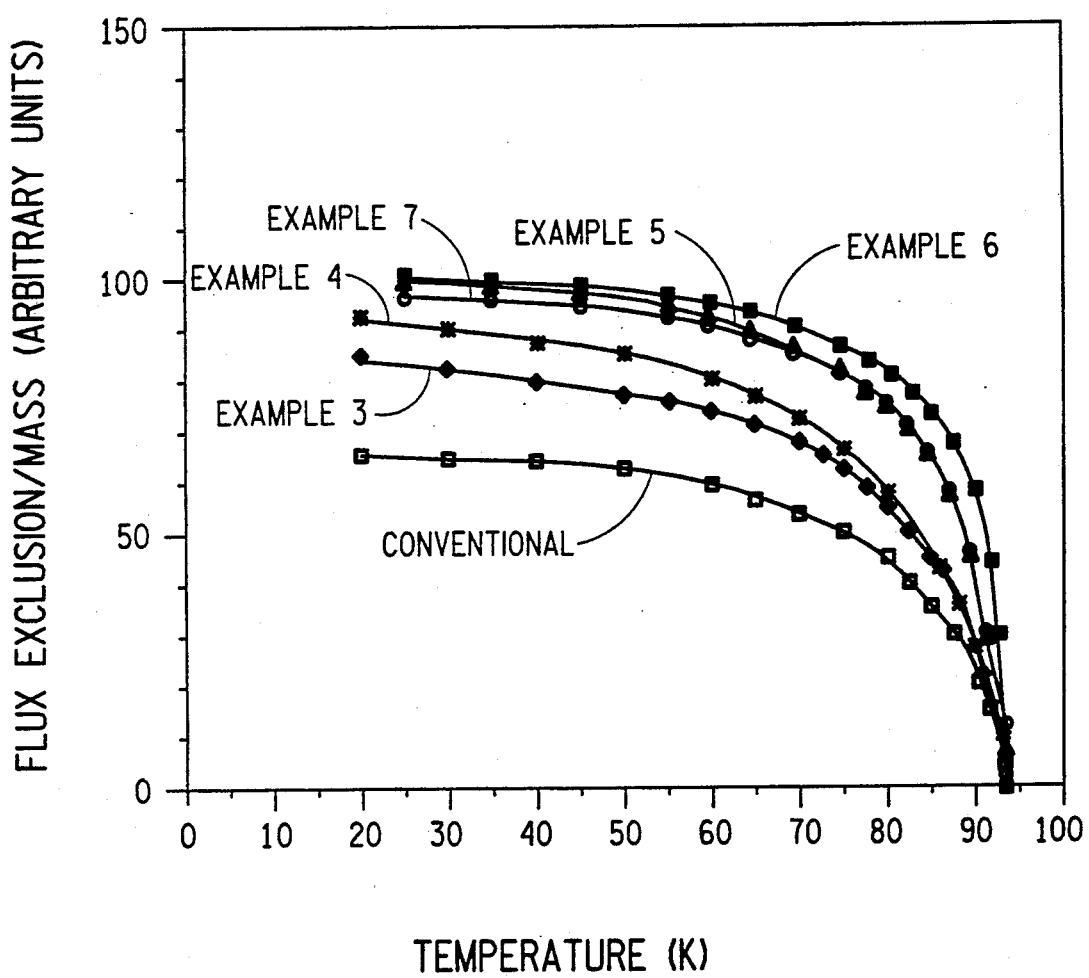
FIG. 4 is a plot of flux exclusion per unit mass of sample versus temperature for conventional $YBa_2Cu_3O_x$ powder and for $YBa_2Cu_3O_x$ powders of the invention which were heated in a different temperatures.

Flux exclusion measurements were carried out on all five examples and the results are shown in FIG. 4. The flux exclusion for Examples 3 and 4 which were heated at 870° C. and 895° C., respectively, show significant improvement over the conventional powder. The flux exclusions for Examples 5, 6 and 7 which were heated at 920° C., 945° C. and 970° C. showed the most improvement over the conventional powder and were quite similar. Example 6 exhibited a slightly sharper transition than the other powders.

Elemental maps of the variations in the yttrium, barium, and copper concentrations as a function of position as well as a map with the elemental maps superimposed (maps not shown in the Drawing) were obtained for the conventional powder, the powder of Example 3 and the powder of Example 6. Example 3 shows considerable improvement over the conventional powder regarding homogeneity. However, a significant degree of segregation remains. In contrast, Example 6 is essentially homogeneous throughout. The variations in homogeneity observed in the elemental maps correlate with the flux exclusion data shown in FIG. 4, the greater the degree of homogeneity, the greater the flux exclusion.

EXAMPLES 8-10

The effect of heating time in an oxygen-containing atmosphere was investigated in these three Examples. Three samples of conventional $YBa_2Cu_3O_x$ powder prepared in Example 1 were subjected to the process of this invention essentially as described in Example 6 except that for Examples 9 and 10 the time for which the sample was held at 945° C. in oxygen was 1 hour and 5 hours, respectively, rather than 3 hours as for Example 6. Example 8 is essentially identical to Example 6 and the time for which the sample was held at 945° C. in oxygen was 3 hours. The flux exclusion curves for the three powders produced in Examples 8-10 are essentially identical and are not sensitive to the oxygen heating times.

EXAMPLES 11-13

The effect of heating temperature in an oxygen-containing atmosphere was investigated in these three Examples. Three samples of conventional $YBa_2Cu_3O_x$ powder prepared in Example 1 were subjected to the process of this invention essentially as described in Example 6 except that the temperature to which the samples were heated and held in the nitrogen-containing atmosphere was 920° C. rather than 945° C. and the temperatures at which the samples were heated in an oxygen-containing atmosphere for 3 hours were 770° C. and 870° C. respectively for Examples 11 and 12. The corresponding temperature used in Example 13 was 945° C. as used in Example 6. The flux exclusion curves for the three powders produced in Examples 11-13 are essentially identical and are not sensitive to the oxygen heating temperatures.

EXAMPLE 14

Conventional $YBa_2Cu_3O_x$ powder was prepared using essentially the process described in Example 1.

$YBa_2Cu_3O_x$ powder (10 grams) was placed in an yttria-stabilized zirconia boat. The boat containing the powder was placed inside a quartz tube in the middle of a furnace. A mixture of about 10% nitrogen dioxide and 90% oxygen was passed over the sample at a rate of about 100 standard cubic centimeters per minute (sccm). The sample was heated from room temperature to 950° C. over a period of 1.5 hours and held at 950° C. for about 2 hours. With the temperature maintained at 945° C., the gas stream was gradually changed to pure oxygen over a period of about 1 hour and the temperature was then held at 950° C. for 2 hours. The sample was then cooled to 450° C. over a period of 4 hours, cooled to 400° C. over a period of 1 hour and then furnace cooled over a period of about 5 hours to room temperature.

Flux exclusion measurements were made and the flux exclusion curve obtained is similar to that obtained when argon is used as a carrier gas for the nitrogen dioxide.

EXAMPLES 15-17

In this Example, $YBa_2Cu_3O_x$ powder with improved properties was produced directly from precursors of $YBa_2Cu_3O_x$.

Precursor powder (10 grams) comprised of an intimate mixture of $Y_2O_3$, $BaCO_3$, and $CuO$ with the atomic ratio of Y:Ba:Cu of 1:2:3 was placed in an alumina boat and placed in a furnace. A mixture of about 10% nitrogen dioxide and 90% argon was passed over the sample at a rate of about 100 standard cubic centimeters per minute (sccm). The powder was heated over a 90 minute period to a temperature of 750° C., 850° C. and 950° C., respectively, for Examples 15, 16 and 17 and then held at that temperature for 2 hours. The gas was then switched to pure oxygen over a 1 hour period while the temperature was adjusted to 950° C. and the temperature was then held at 950° C. for 2 hours. The sample was then cooled to 450° C. over a period of 4 hours, cooled to 400° C. over a period of 1 hour and then furnace cooled over a period of about 5 hours to room temperature.

Figure 5:
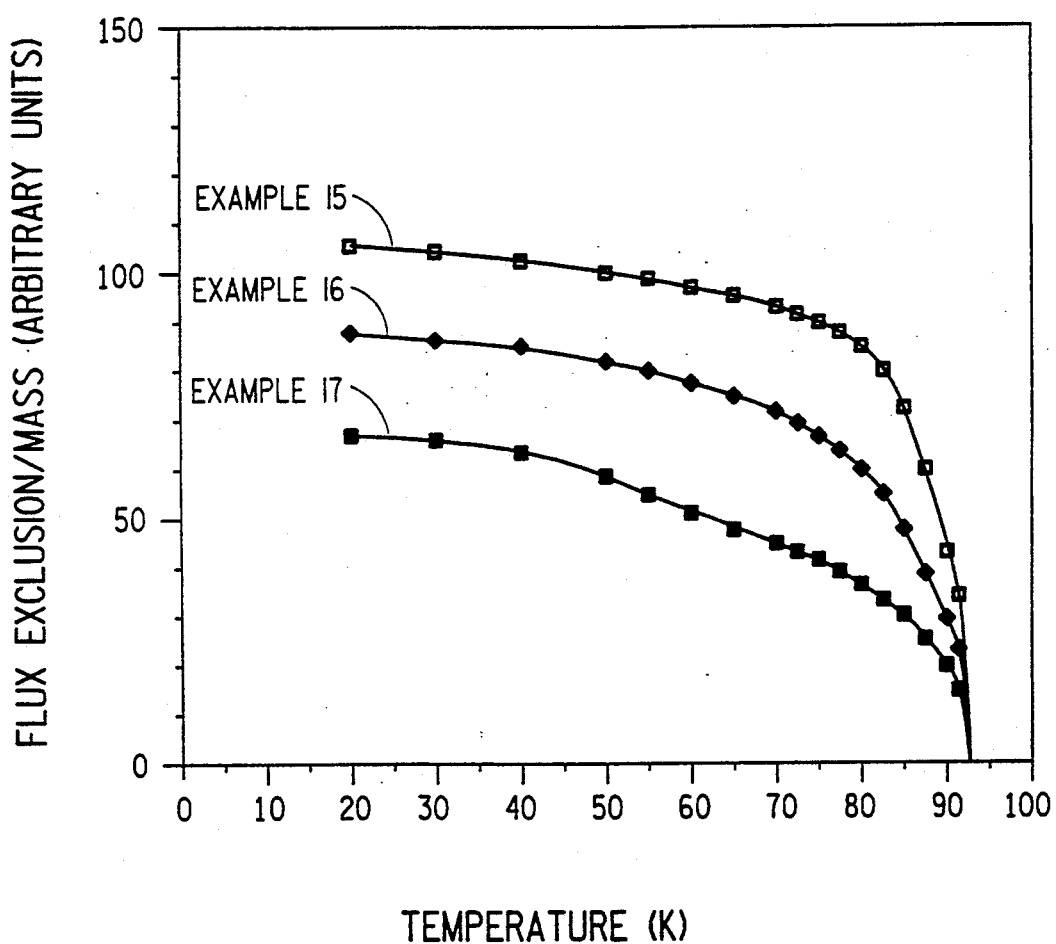
FIG. 5 is a plot of flux exclusion per unit mass of sample versus temperature for $YBa_2Cu_3O_x$ powders of the invention which were prepared from precursors and which were heated in a nitrogen dioxide-containing atmosphere at different temperatures.

Flux exclusion measurements were carried out and the results are shown in FIG. 5. The powder heated in the nitrogen dioxide-containing atmosphere at 750° C. has higher flux exclusion than those heated at 850° C. or 950° C.

I claim:
1. Process for preparing homogeneous superconducting $MBa_2Cu_3O_x$, wherein M is at least one element chosen from the group consisting of Y, La, Nd, Sm, Eu, Gd, Dy, Ho, Er, Tm, Yb and Lu, and x is from about 6.5 to about 7.0, said process comprising:
   (a) heating at least one starting material selected from the group consisting of (1) $MBa_2Cu_3O_x$, (2) $MBa_2Cu_3O_y$ wherein y is from about 6.0 to about 6.5, and (3) a mixture of M-, Ba- and Cu-containing $MBa_2$-

$Cu_3O_x$ precursors, said mixture having an M:Ba:Cu atomic ratio of about 1:2:3 in the presence of an atmosphere containing at least about 1% nitrogen dioxide at a temperature of from about 600° C. to about 1000° C. for at least about one hour;

(b) heating the product of step (a) in the presence of an oxygen-containing atmosphere at a temperature of from about 700° C. to about 975° C. for at least about one-half hour; and (c) maintaining the product of step (b) in the presence of an oxygen-containing atmosphere while cooling for a time sufficient to obtain said $MBa_2Cu_3O_x$.

2. Process of claim 1 wherein the starting material is $MBa_2Cu_3O_x$ or $MBa_2Cu_3O_y$.

3. Process of claim 2 wherein the temperature of step (a) is from about 700° C. to about 1000° C.

4. Process of claim 3 wherein the temperature is from about 900° C. to about 975° C.

5. Process of claim 1 wherein the starting material is a mixture of M-, Ba-, and Cu-containing $MBa_2Cu_3O_x$ precursors in an M:Ba:Cu atomic ratio of about 1:2:3.

6. Process of claim 5 wherein the temperature of step (a) is from about 600° C. to about 900° C.

7. Process of claim 6 wherein the temperature is from about 700° C. to about 800° C.

8. Process of claim 1 wherein M is Y.

* * * * *